United States Patent [19]

Rose et al.

[11] Patent Number: 4,675,530

[45] Date of Patent: Jun. 23, 1987

[54] CHARGE DENSITY DETECTOR FOR BEAM IMPLANTATION

[75] Inventors: Peter H. Rose, North Conway, N.H.; Marvin Farley, Ipswich, Mass.

[73] Assignee: Eaton Corporation, Cleveland, Ohio

[21] Appl. No.: 753,736

[22] Filed: Jul. 11, 1985

[51] Int. Cl.⁴ ............................................. H01J 37/00
[52] U.S. Cl. ................................................. 250/492.2
[58] Field of Search ................ 250/492.21, 315.3, 397; 369/72, 73, 126; 365/7

[56] References Cited

U.S. PATENT DOCUMENTS

| | | |
|---|---|---|
| 3,507,709 | 4/1970 | Bower . |
| 4,118,630 | 10/1978 | McKenna et al. ............. 250/492.21 |
| 4,228,358 | 10/1980 | Ryding ........................... 250/492.21 |
| 4,234,797 | 11/1980 | Ryding ............................. 250/492.3 |
| 4,249,077 | 2/1981 | Crawford . |
| 4,419,584 | 12/1983 | Benveniste ....................... 250/492.2 |
| 4,463,255 | 7/1984 | Robertson et al. . |

OTHER PUBLICATIONS

A New Dose Control Technique for Ion Implantation—Ryding et al.
The Effect of Ion Implanter Design Upon Implant Uniformity—Wittkower.

Primary Examiner—Bruce C. Anderson
Attorney, Agent, or Firm—D. A. Rowe; F. M. Sajovec

[57] ABSTRACT

Apparatus for accurately measuring the charge distribution, and hence the voltage, on a non-conducting workpiece during ion bombardment. The invention is based on the principal that the charge on the surface of the workpiece induces equal and opposite charge on the surface of an isolated proof plane conductor placed in front of it. A workpiece is moved at a known speed in front of the proof plane, whose dimensions are small compared to the workpiece. The measurement of the time distribution of the induced charge on the proof plane is a measure of the spatial distribution of the charge on the bombarded workpiece. The proof plane surface is isolated from currents which might flow directly to its surface. The invention has utility for several purposes important to the semiconductor industry: monitoring the surface voltage distribution on a given workpiece during ion bombardment; certification to the device user that the workpiece was implanted under specified values or limits of surface voltage distribution; control of the surface charge distribution on the workpiece through the feedback of the charge-measurement signal to a device which compensates the charge on the workpiece.

15 Claims, 9 Drawing Figures

CHARGE DENSITY DETECTOR FOR BEAM IMPLANTATION

DESCRIPTION

1. Technical Field

The present invention relates to a detector for sensing charge build-up during beam treatment of a workpiece.

2. Background Art

Particle beam implant apparatus is used for treating a workpiece by causing particles to impinge upon the workpiece. U.S. Pat. Nos. 4,234,797 to Ryding and 4,419,584 to Benveniste disclose ion beam implantation systems particularly suited for doping semiconductor substrates. These two prior art patents are expressly incorporated herein by reference.

Workpieces such as semiconductor wafers become charged during particle implantation. The reasons for this charging are complex and not well understood at a fundamental level. The empirical fact is that besides the charge injected into the workpiece by the ion beam itself there may also be additional charge injected from electrons or gas ions in the vicinity of the workpiece and there may be both positive ions and electrons released from the wafer.

Charging of the wafer occurs when the implanting beam is made up of neutral particles as well as when it is a positive or a negative ion. Charging of the wafer also occurs even though the net charge in the implanting beam is made neutral by electrons injected into the beam.

The net charge on the surface of the wafer under ion implantation is typically positive. The voltage gradient, between the workpiece surface and nearby grounded conductors, which results from the net charge is undesirable for several reasons. Charge build-up can result in electrical discharge through the workpiece into a grounded backplate. The workpiece may be as thin as 0.05 cm so that a surface voltage of 500 volts produces a 10,000 volt/cm electric field which can result in destructive electrical breakdowns.

The voltage gradient on the surface can adversely affect the charge neutrality of the ion beam together with its accompanying electrons. The charge neutrality of the ion beam is maintained to prevent beam blow-up due to the space charge in high current density beams. The charge neutrality is achieved by introducing low energy electrons into the ion beam upstream from the workpiece to compensate the positive charge of the ions. A positive (negative) voltage on the workpiece will attract (repel) the low energy electrons, destroying the neutrality of the beam and causing undesired beam blow-up.

Finally, the surface voltage gradient can deflect the implanting beam, and change its energy. The beam deflection can result in unacceptable nonuniformities of the implantation dose distribution across the wafer. For all these reasons it is important that the voltage on the surface of the workpiece, arising from the buildup of charge, be kept to a tolerable value, typically less than 100 volts; in some cases less than 10 volts.

To minimize the net charge build-up, techniques have been used to flood the workpiece with electrons. For these techniques to be successful, however, it is important to have a method of measuring the charge on the workpieces.

The need for a charge measuring device as well as requirements on its sensitivity and time response are evident from a consideration of the uniform charging of a typical semiconductor workpiece wafer disk of radius R by an ion implanting beam depositing a net electric charge to the workpiece area.

Typical numbers for ion implantation of semiconductors for device manufacture produce current densities on the order of 10 A/m$^2$, so that if the full current were to charge the workpiece, the charge density would grow at a rate of 10 Coulombs/m$^2$/sec. The potential, in volts, which results from the charge build-up can be determined for both points along the axis through the center of a circular workpiece disk and for points along the workpiece perimeter.

For points along an axis a distance Z from the center of the disk, the voltage V which results from a uniform charge density $\sigma$ is given by $$V = 5.6 \times 10^{10} \, \sigma[(Z^2 + R^2)^{\frac{1}{2}} - Z] \tag{1}$$

The charge induced electric field extends far in front of the workpiece. According to Eq. 1, the voltage is still 10% of the maximum at a distance along the axis equal to 5 workpiece radii.

The voltage at the perimeter, a distance R from the center of the uniformly charged disk is given by $$V(\text{perimeter}) = 3.6 \times 10^{10} \, \sigma R, \tag{2}$$

which is about 65% of that at the center. Thus a radial electric field exists which can distort the beam trajectories even when the charge density on the workpiece is uniform.

Typical ion beam implantation practice requires that the voltage on the workpiece wafer never exceed 100 volts, and preferably be kept below 10 volts. These restrictions place strong requirements on the net current flowing to the workpieces. The voltage at the center of a typical workpiece, having a radius of 5 centimeters, rises at the rate of 360 volts/second when experiencing a net current flow of one nanoamp. This current flow is one millionth that of the typical direct ion current injected into the workpiece.

DISCLOSURE OF INVENTION

The present invention measures the charge on a workpiece with an accuracy and sensitivity sufficient to meet the needs of particle beam treatment systems. Knowledge concerning charge density and distribution is used to avoid the damaging field strengths associated with charge build-up. The integrity of the workpiece is assured and beam control maintained.

A typical particle beam system includes a source for directing a beam of particles at a workpiece to cause a distribution of particles to contact a workpiece surface. By way of example, such a system is used for doping semiconductor material in the form of individual wafers supported for movement through a charged ion beam. Contact between the beam of particles and a workpiece surface results in a charge build-up which is detected by a charge detector positioned relative to the workpiece surface. The detector determines charge distribution on the workpiece by means of a conductor isolated from and facing the workpiece. The conductor experiences a charge build-up due to induction from the charge on the workpiece surface. A sensor coupled to the isolated conductor senses the charge build-up on the conductor and thereby senses the charge build-up on the workpiece surface.

In one system, a number of semiconductor wafers are supported on a rotating disk and moved through a beam of charged ions which dopes the semiconductor wafers. In this system, the charge sensor includes a charge integrator that produces a time varying signal proportional to the charge density on each wafer as it rotates past the detector. Uniformity of particle ion beam impingement can be detected using such a technique and in addition, the information regarding charge density can be utilized to controllably dissipating the charge build-up.

This controlled dissipation is accomplished via a discharge device mounted next to the wafers' path of travel. Electrons are typically directed toward each wafer surface to dissipate the positive charge build-up resulting from particle impingement upon the wafer. A control circuit coupled between the charge detector and dissipating circuit adjusts the rate of discharge to correspond to the rate of charge build-up as that build-up occurs.

The preferred detector includes a proof plane enclosed in an isolated housing having a front surface electrically isolated from the housing. This detector is mounted in close proximity to a rotating support so that as individual integrated circuit wafers pass the proof plane the charge on the wafers is detected.

From the above it should be appreciated that one object of the invention is control of charging in a beam particle system whereby the charge build-up caused by particle beam contact with the workpiece is monitored and preferably controlled to avoid problems due to the charge build-up. This and other objects, advantages and features of the invention will become better understood when a detailed description of a preferred embodiment of the invention is described in conjunction with the accompanying drawings.

BEST MODE FOR CARRYING OUT THE INVENTION

Figure 1:
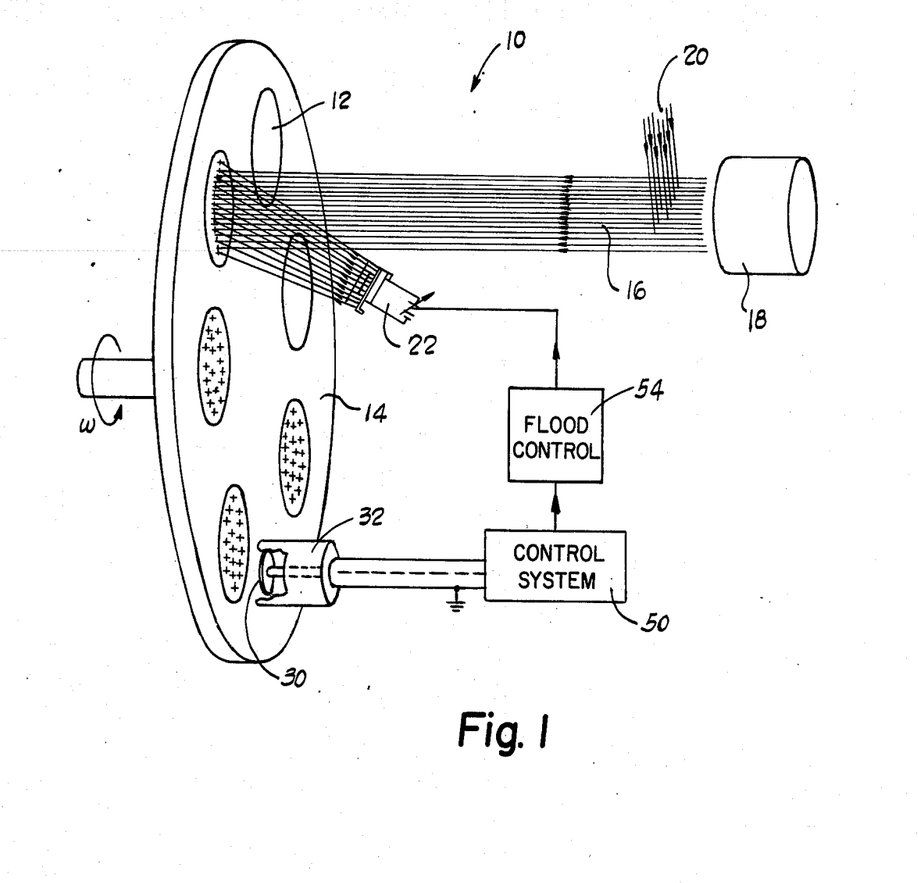
FIG. 1 is a perspective schematic of a particle beam system for ion implantation.
Figure 2:
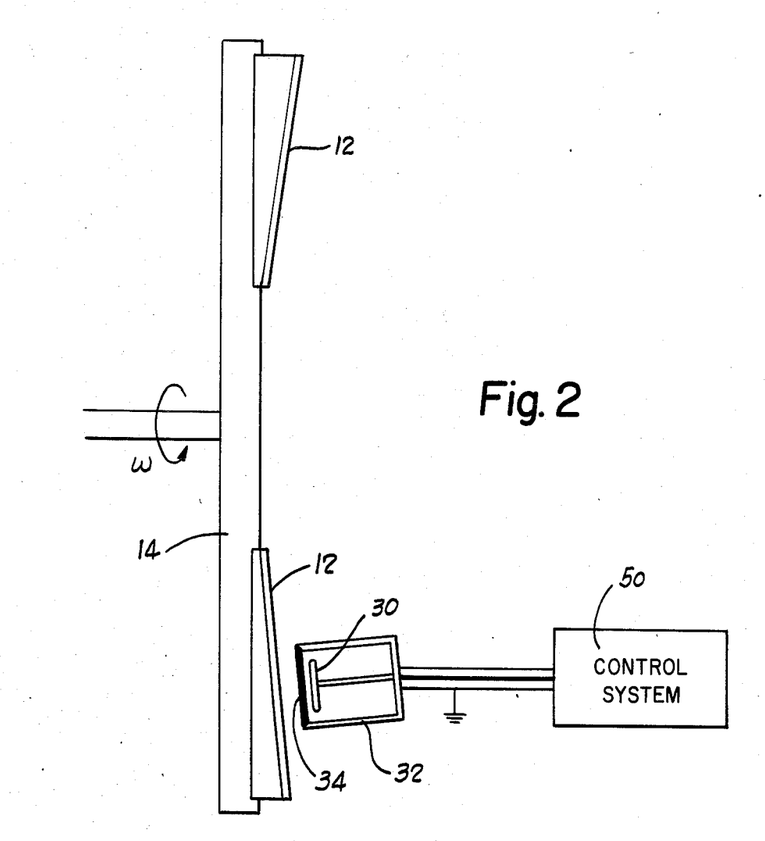
FIG. 2 is a schematic elevation view of the FIG. 1 system showing a relationship between individual semiconductor wafers and a charge detector.

Turning now to the drawings, FIG. 1 is a schematic view of a beam implantation system 10. Workpieces in the form of thin, semiconductor disks 12 are held on a support 14 which rotates at constant angular velocity w in front of an ion beam 16. The disks 12 can be flush with the support 14 or may be held at an angle (typically 7°) as shown in FIG. 2.

A positive ion beam 16 from an ion-accelerator source 18 is kept electrically neutral by the introduction, upstream from the workpiece, of low energy electrons 20 by techniques known in the ion implantation art. Despite the neutrality of the ion beam the disks 12 become charged, typically positively, as indicated. An electron source 22 sprays electrons onto the disks during implantation to maintain a net electrical neutrality of current flowing to and from the workpiece. Deviations from that neutrality lead to the build-up of charge and voltage on the surface of the disks.

After traversing the ion beam, the disks pass in front of the surface of the proof plane 30 which is enclosed in an isolated housing 32 having a cover 34, which (FIG. 2) is electrically isolated from the housing 32 and the proof plane 30. The front cover 34 is typically an insulator but may be an electrically floating conductor. In the configuration of FIG. 1, in which the face of the workpiece is flush with the holder the gap between the proof plane and the wafer-carrying plate never varies so that the capacitance of the system is constant. The induced charge on the proof plane 30 is given by an integral of the area the proof plane overlaps the disk times the charge density.

Figure 3A:
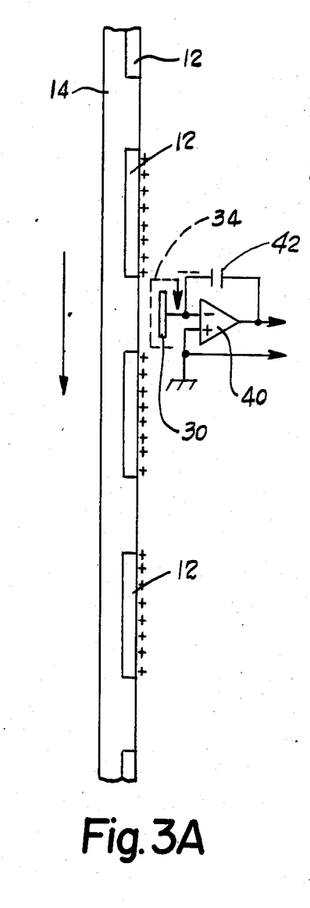
FIGS. 3A through 3C schematically illustrates a time varying relationship between a detector and multiple semiconductor wafers subjected to ion implantation.

The induced charge on the proof plane grows as an electrically charged disk enters the line of sight of the proof plane, FIG. 3A. After the initial transient response due to the change in the area of charge seen by the proof plane, the induced charge on the proof plane attains a constant value during the position shown in FIG. 3B. When the workpiece passes from the view of the proof plane, FIG. 3C, the induced charge on the proof plane diminishes.

Figure 3B:
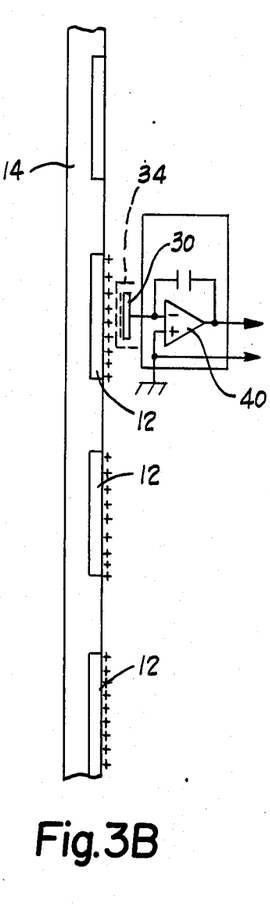
Figure 3C:
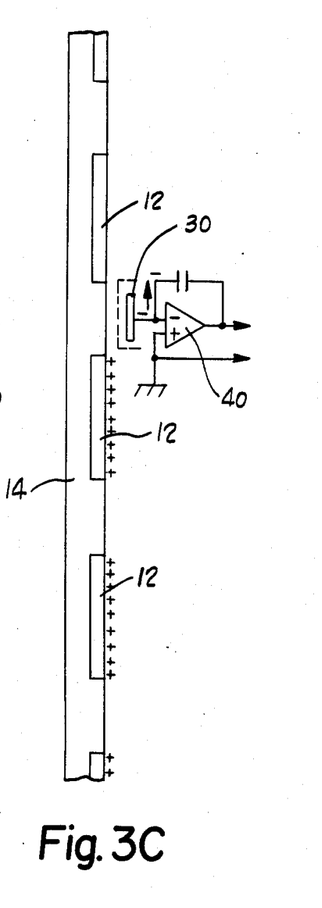

The induced charge as a function of time is a current which is input to an integrator 40, FIG. 3. An output signal from the integrator 40 is proportional to the total charge on the proof plane divided by the capacitance of a feedback capacitor 42. The time constant of the integrating circuit is short compared to the transient edge effects but long compared to the time it takes for the wafer to traverse the proof plane. The output voltage from the integrator then gives an averaged signal proportional to the charge density on the central surface of the wafer 12.

Figure 4A:
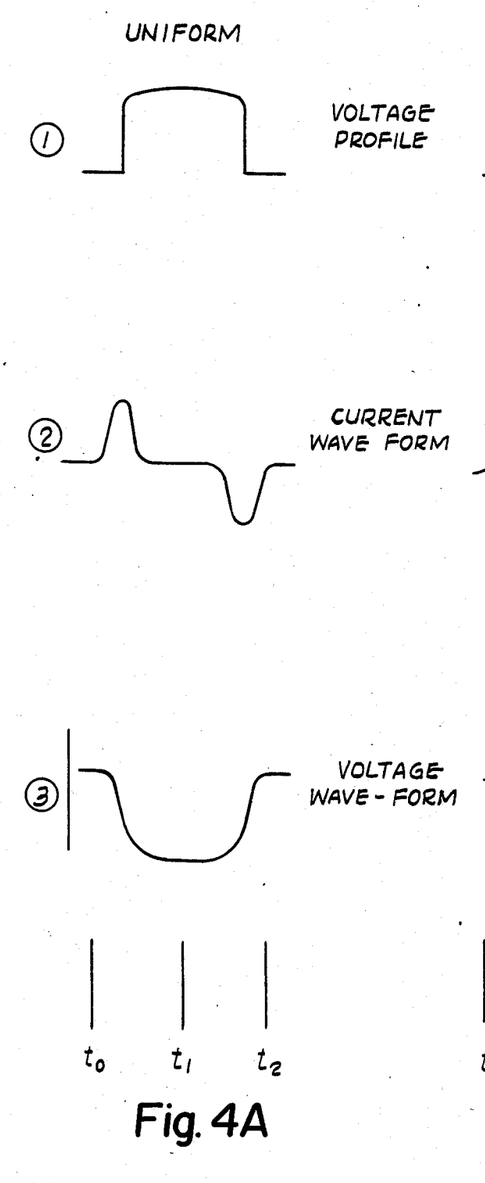
FIGS. 4A and 4B shows voltage, current, and output signal waveforms for the FIG. 3 detectors.
Figure 4B:
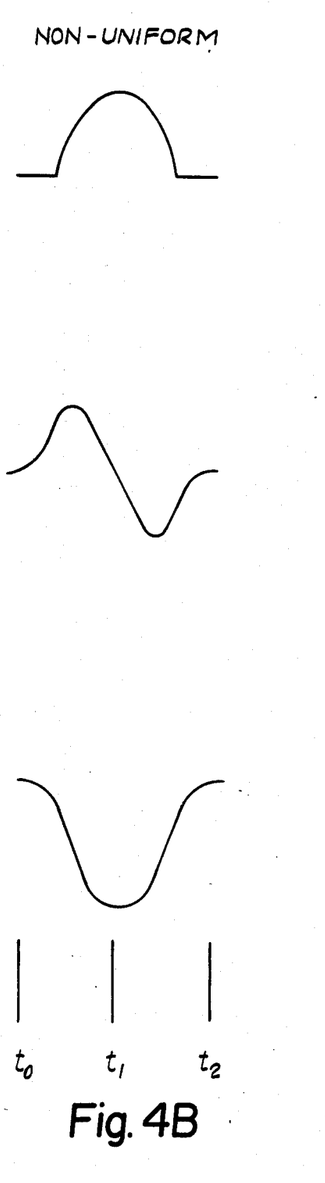

The current and voltage signals produced from a uniform and non-uniform charge density on the workpiece are shown in FIG. 4; the time positions, $t_0$, $t_1$ and $t_2$ shown in FIG. 4 correspond to the positions shown in FIGS. 3A, 3B and 3C respectively. A uniform positive charge distribution on the workpiece results in a voltage distribution shown in FIG. 4A1. As the workpiece moves by the proof plane 30 a current, FIG. 4A2, flows into the integrator which results in an output voltage from the integrator as shown in FIG. 4A3. If the charge distribution on the workpiece is not uniform, but, for example, has a bell-shaped distribution peaked at the wafer center, FIG. 4B1, then the output voltage is proportional to the charge density averaged over the integration time constant and appears as shown in FIG. 4B3.

In actual practice, semiconductor wafers 12 are mounted at an angle, shown schematically in FIG. 2, of 7° to the workpiece support 14, so that the surfaces of the workpiece and support are not flush. There will then be induced voltages due to the changing capacitance as the proof plane is traversed by the rotating system. However, such changes are essentially equivalent to those due to the change in the overlap area between the wafer and the proof plane and are subsumed under the transient signals described above.

An integration time constant for the induced charge is chosen to eliminate transient responses while giving a proper measure of the slowly varying charge across the wafer surface. This is adequate for present state of the art device manufacture using energetic projectile beams. The constancy of both the geometry and the rotational speed of the wafer holder makes practical the precise analogue subtraction of signals which arise from geometrical effects. This makes possible measurement of the charge distributions across the wafer.

In the ideal geometry of a charged wafer moving in an excellent vacuum, the charge density distribution can be accurately measured without shielding the proof plane 30. The environment of an ion implanter is far from ideal. A residual gas is generally purposefully introduced in the system in order to neutralize the net charge on the beam. There are ions and electrons having broad energy distributions moving randomly in the volume as a consequence of scattering of the beam projectiles. These ambient charged particles, if allowed to strike the proof plane, result in currents which corrupt the proof plane measurements.

One feature of the invention is isolation of the proof plane from direct currents by the front cover 34. The isolation must be transparent to the induction effect which is used to measure the charge on the workpiece. It is therefore necessary that the surface of the cover 34 be electrically isolated. In the disclosed embodiment, presently used, this isolation is accomplished by making the surface out of an insulating ceramic. In another embodiment, the isolation is accomplished by making a front surface of a thin conductor and electrically insulating this conductor from the cover 34.

Calibration

The appropriately integrated induced current measures the charge density on the workpiece. The voltage on the workpiece surface can be theoretically deduced from the charge density. In practice, a charge inductor meter is calibrated by measuring the induced output voltage from the integrator which results from placing a known charge, via a calibrated battery, on a conducting replica of the spinning workpiece. Many tests under varying conditions have shown that the system as described can readily detect a 10 volt potential on a workpiece; the minimal detectable potential on the workpiece is about 2 volts with the integrator 40 shown in FIG. 3.

Response Time

In the simplest embodiment of the invention, a single proof plane 30 is placed, as in FIG. 1, so that the center of the workpiece crosses in front of the proof plane after each implantation dose. In a typical industrial application, the disks rotate at a mean radius of about 11 inches at a rate of 800 rpm. With the proof plane 30 separated 15° of rotation from the beam, the charge measurement is made within 5 milliseconds of each implantation. This time is short enough for effective monitoring of the voltage on the disk to prevent that voltage from exceeding a predetermined value.

Control

Figure 5:
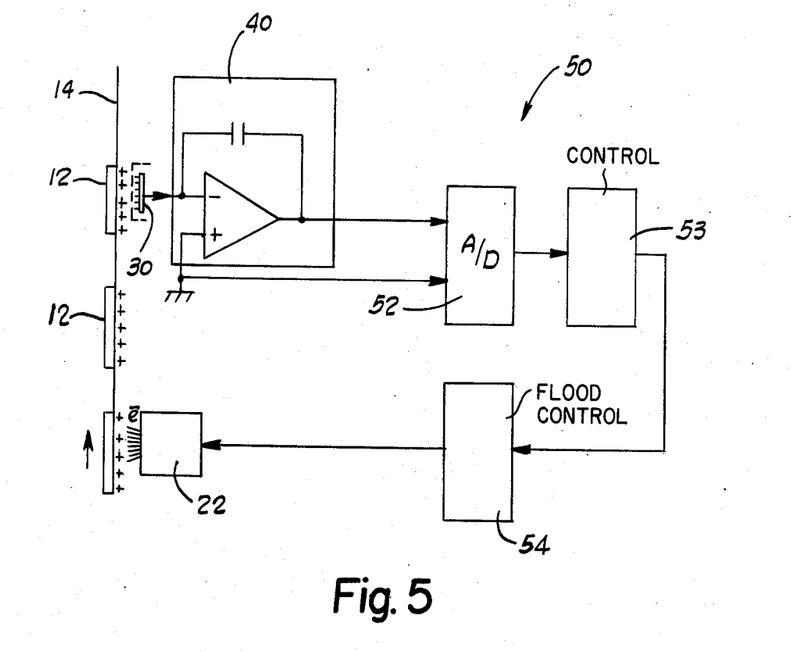
FIG. 5 shows a schematic diagram of a control system used for discharging positive charge that has built-up on a workpiece surface.

The signal from the proof plane 30 is used to control the charging of the disks 12 by varying the density of electrons flooding the disks. A block diagram for one such control system 50 is shown in FIG. 5. The output voltage from the integrator is digitized by an analogue to digital converter 52. The digitized signal is then processed and interpreted by a controller 53 and output to an electron flood control circuit 54 coupled to the electron source 22. In one embodiment, FIG. 5A, the source 22 is a secondary electron emitter where the number of secondary electrons per second is readily controlled by controlling the accelerating voltage of a primary electron source in the emitter.

Figure 5A:
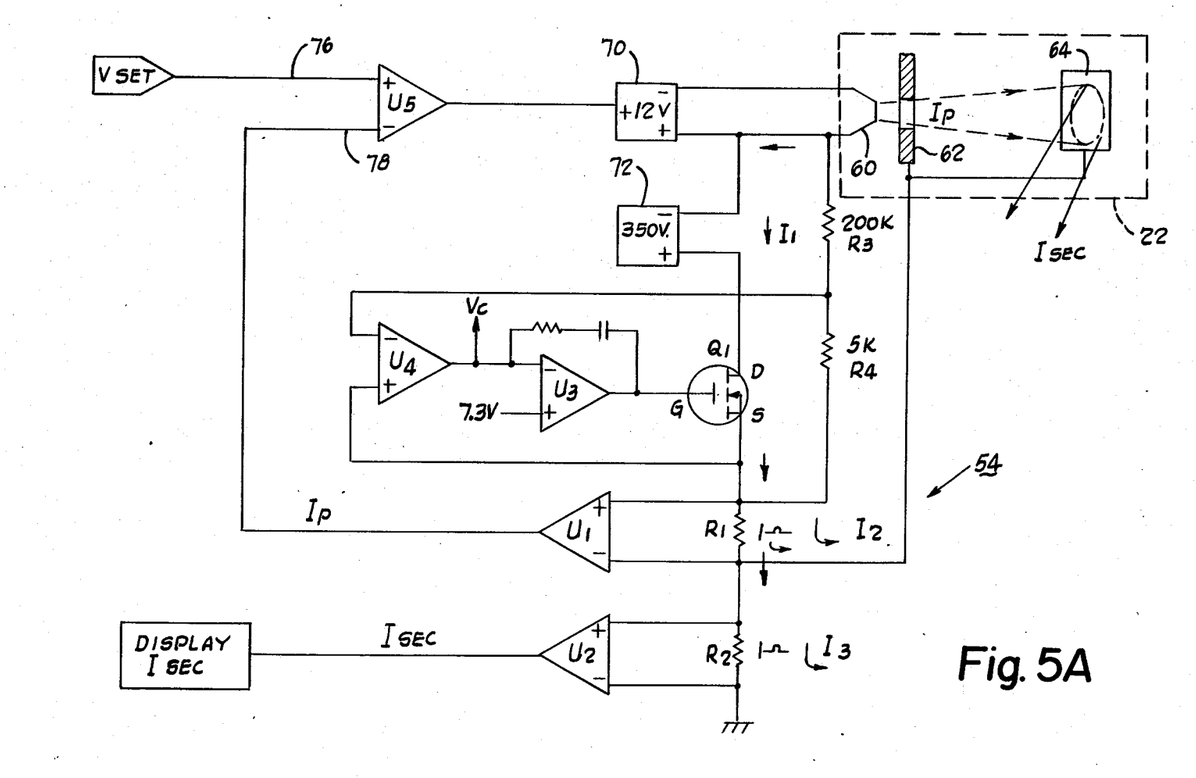
FIG. 5A shows a schematic diagram of an electron source and control circuit.

The electron source 22 includes a tungsten cathode emitter 60, an extractor grid 62, and a target 64 for stopping primary electrons. The primary electrons are accelerated to 300 electron volts and stopped when they collide with the target surface. Secondary electrons are then ejected from the target surface with an energy much less than that of the primary electrons. Since the target is biased near zero volts the required energy for an electron to escape is the work function of the target material. The number of secondary electrons that escape is directly proportional to the number of primary electrons and the secondary electron yield for the target material. The escaping electrons have an energy range beginning with the work function and ending with 300 electron volts, however the largest number of electrons populate the lower energy spectrum and reach a maximum at 25 eV.

The target 64 is positioned such that most of the electron trajectories cross the ion beam 16 in front of the implant surface. This is an important feature in that negative charging of the implant surface is minimized when the ion beam is missing.

The electron source controller 54 includes a filament power supply 70, a cathode bias power supply 72, and electronics for controlling the primary electron current of the source 22. The primary electron current is controlled by varying the output of the filament power supply 70. The output of the filament supply is controlled as a function of the difference between a primary current input 76 from the controller 53 and a fed back primary current input 78. The difference in these two signals is coupled to the power supply 70 to regulate current through the cathode. Amplifier U1 provides an output voltage in proportion to the primary current Ip. Amplifier U2 provides an output voltage in proportion to secondary current Isec. Amplifier U3 controls the cathode voltage by controlling the gate to source voltage of a FFT Q1 as a function of the difference between a preset cathode voltage Vc and the fed back cathode voltage. Amplifier U4 provides an output voltage in proportion to the cathode voltage.

There are two current loops that are significant in FIG. 5A, the primary and secondary loop. The primary loop current is measured by the 1 ohm resistor R1 while the secondary current loop is measured by the 1 ohm resistor R2. For the circuit of FIG. 5A the following relations hold for the currents depicted.

$I1 = Ip$
$I2 = Ip - Isec$
$I3 = Isec$
$Ip =$ primary current emitted from the cathode.
$Isec =$ secondary current emitted from the target surface.

A single proof plane 30 determines the charge distribution across a given arc segment of the wafers 12 during each rotation of the support. If the support is translated across the beam during the rotation, as is often done in commercial ion implanters, the proof plane 30 measures the charge distributions of the arc segments in front of it. A single proof plane is generally adequate for most applications, since the proof plane is positioned to measure the arc segment which has just undergone ion implantation.

The present invention can be readily extended, however, to measure the charge distribution across an entire workpiece instead of a single arc. Multiple independent proof planes are arranged in a suitable manner in front of the rotating support. Independent charge inductor meters may be in a single chamber with one insulator window between the faces of the rotating wafers and multiple proof planes or they may each be housed in independent chambers. The only requirement is that the proof planes be electrically isolated from each other by ground planes and that the currents from individual proof planes be processed by independent electronics.

While the invention has been described with a degree of particularity, it is the intent that the invention include all modifications and alterations falling within the spirit or scope of the appended claims.

We claim:

1. Apparatus comprising a source for directing a beam of particles at a workpiece to cause a distribution of particles to contact a generally planar workpiece surface, said contact resulting in a charge build-up on said workpiece surface, support means for positioning the workpiece in the beam of particles, detector means positioned in relation to the workpiece surface for determining a charge on said workpiece surface, said detector means including a conductor having a conductive surface electrically isolated from said workpiece and positioned in close proximity to the workpiece surface so that charge build-up on the workpiece surface induces an induced charge on the conductive surface, and sensing means for sensing the induced charge build-up on the conductive surface by monitoring a signal related to the induced charge.

2. The detector of claim 1 for use in a system where the workpiece comprises a rotating conductive support to which one or more semiconductor wafers are attached, said sensing means comprising a charge integrator for generating a time varying signal proportional to the induced charge on said conductive surface as said one or more semiconductor wafers rotate past the detector means.

3. Apparatus comprising:
a source for generating a beam of particles;
a rotatable support for moving one or more workpieces through the beam to treat said workpieces;
a detector mounted next to the support for sensing a charge build-up on the workpieces as they are treated, said detector including a conductor electrically isolated from the workpieces that is charged by induction as the workpieces move past the conductor and a charge detection circuit for converting an induced charge on said conductor to a voltage signal;
charge dissipating means mounted next to the support to controllably discharge said workpieces; and
control circuitry coupling the detector to the charge dissipating means to adjust the discharge of said one or more workpieces in response to the voltage signal from the charge detection circuit.

4. The apparatus of claim 3 where the support is a conductor and the workpieces comprise semiconductor wafers mounted to the support for treatment by a ion beam of charged particles.

5. The apparatus of claim 3 where the charge detection circuit comprises means to integrate charge as said charge is induced on the conductor.

6. A method for controlling a charge build-up caused by particle beam contact with a workpiece surface comprising the steps of:
positioning a workpiece on a support;
directing a beam of particles at a workpiece treatment surface to cause said particles to impact said treatment surface;
positioning a charge sensor having a conductive surface next to said support;
moving the workpiece relative the charge sensor so that accumulated charge of a first polarity as a result of particle contact with said treatment surface induces an opposite polarity charge on the conductive surface;
sensing the opposite polarity charge on the conductive surface; and
discharging the workpiece surface by directing charged particles to said workpiece surface with an intensity related to a sensed charge on the conductive surface.

7. The method of claim 6 wherein the workpiece comprises a rotatably mounted support for mounting semiconductor wafers and the positioning step is performed by rotating the wafers past the conductor.

8. The method of claim 7 wherein the sensing step is accomplished by integrating the charge induced on the conductor.

9. Apparatus comprising:
an ion source for generating an ion beam;
a rotatable support for moving one or more workpieces through the ion beam to treat said workpieces;
a detector mounted next to the support for sensing charge build-up on the workpieces as they are treated, said detector including a conductor mounted next to a workpiece path so that as a charged workpiece moves past the conductor said conductor is charged by induction;
isolation means positioned between the workpiece path and the conductor for isolating the conductor from contact with charge in the region of the detector;
charge dissipating means mounted next to the support to controllably discharge said workpieces; and
control circuitry coupling the detector to the charge dissipating means to adjust the discharge of said one or more workpieces in response to the charge sensed by the deteector.

10. The apparatus of claim 9 wherein the control circuitry comprises means for measuring a voltage gradient as a workpiece passes in front of the detector.

11. The apparatus of claim 9 wherein the charge dissipating means comprises a cathode for emitting electrons and an anode for intercepting electrons from the cathode and emitting secondary electrons that dissipate charge on the workpieces and wherein the control circuitry includes means to control electron current emitted from the cathode.

12. The apparatus of claim 9 wherein the detector comprises a charge integration circuit to convert a charge on the conductor into a voltage input to the control circuit.

13. The apparatus of claim 1 where the detector means comprises a housing enclosing said conductive surface, said housing including a cover to isolate the conductive surface from direct ion currents while permitting said induced charge to build up on said conductive surface.

14. The apparatus of claim 13 wherein the cover comprises an insulating ceramic material.

15. The apparatus of claim 9 where the isolation means comprises a housing enclosing the detector, said housing including a cover to isolate the conductor of said detector from contact with charged particles in the region of the housing.

* * * * *